United States Patent
Yen et al.

(10) Patent No.: US 9,633,940 B2
(45) Date of Patent: Apr. 25, 2017

(54) STRUCTURE AND METHOD FOR A HIGH-K TRANSFORMER WITH CAPACITIVE COUPLING

(71) Applicant: Taiwan Semiconductor Manufacturing Company, Ltd., Hsin-Chu (TW)

(72) Inventors: Hsiao-Tsung Yen, Tainan (TW); Chin-Wei Kuo, Zhubei (TW); Ho-Hsiang Chen, Hsinchu (TW); Min-Chie Jeng, Taipei (TW); Yu-Ling Lin, Beitou District Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/803,205

(22) Filed: Jul. 20, 2015

(65) Prior Publication Data

US 2015/0325517 A1    Nov. 12, 2015

Related U.S. Application Data

(63) Continuation of application No. 13/280,786, filed on Oct. 25, 2011, now Pat. No. 9,087,838.

(51) Int. Cl.
*H01L 21/02* (2006.01)
*H01L 23/64* (2006.01)
(Continued)

(52) U.S. Cl.
CPC ..... *H01L 23/5222* (2013.01); *H01F 17/0013* (2013.01); *H01L 21/76805* (2013.01);
(Continued)

(58) Field of Classification Search
CPC ............... H01F 17/0013; H01F 17/002; H01F 2017/002; H01F 2017/0086;
(Continued)

(56) References Cited

U.S. PATENT DOCUMENTS 5,391,917 A    2/1995 Gilmour et al.
5,510,298 A    4/1996 Redwine
(Continued)

OTHER PUBLICATIONS

Unpublished U.S. Appl. No. 13/411,052, filed Mar. 2, 2012 entitled "Structure and Method for a Fishbone Differential Capacitor," 38 pages.
(Continued)

*Primary Examiner* — Marvin Payen
*Assistant Examiner* — Jeremy Joy
(74) *Attorney, Agent, or Firm* — Haynes and Boone, LLP

(57) ABSTRACT

The present disclosure provides a semiconductor device. The semiconductor device includes a semiconductor substrate having an integrated circuit (IC) device; an interconnect structure disposed on the semiconductor substrate and coupled with the IC device; and a transformer disposed on the semiconductor substrate and integrated in the interconnect structure. The transformer includes a first conductive feature; a second conductive feature inductively coupled with the first conductive feature; a third conductive feature electrically connected to the first conductive feature; and a fourth conductive feature electrically connected to the second conductive feature. The third and fourth conductive features are designed and configured to be capacitively coupled to increase a coupling coefficient of the transformer.

20 Claims, 17 Drawing Sheets

(51) Int. Cl.

| | | |
|---|---|---|
| *H01L 23/58* | (2006.01) | |
| *H01F 17/00* | (2006.01) | |
| *H01L 23/522* | (2006.01) | |
| *H01L 49/02* | (2006.01) | |
| *H01L 21/768* | (2006.01) | |
| *H01L 23/528* | (2006.01) | |
| *H01L 23/552* | (2006.01) | |

(52) U.S. Cl.
CPC ...... *H01L 21/76877* (2013.01); *H01L 23/528* (2013.01); *H01L 23/5225* (2013.01); *H01L 23/5227* (2013.01); *H01L 23/642* (2013.01); *H01L 23/645* (2013.01); *H01L 28/10* (2013.01); *H01L 23/552* (2013.01); *H01L 2924/0002* (2013.01)

(58) Field of Classification Search
CPC ............. H01L 23/5227; H01L 23/5223; H01L 23/5225; H01L 23/645; H01L 23/642; H01L 28/10; H01L 2924/19042; H01L 2924/0002
See application file for complete search history.

(56) References Cited

U.S. PATENT DOCUMENTS

| | | | |
|---|---|---|---|
| 5,767,001 A | 6/1998 | Bertagnolli et al. | |
| 5,831,311 A | 11/1998 | Hsu et al. | |
| 5,831,331 A * | 11/1998 | Lee ..................... | H01L 23/645 257/277 |
| 5,936,298 A | 8/1999 | Capocelli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,383,858 B1 | 5/2002 | Gupta et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine et al. | |
| 6,664,129 B2 | 12/2003 | Siniaguine et al. | |
| 6,693,361 B1 | 2/2004 | Siniaguine et al. | |
| 6,740,582 B2 | 5/2004 | Siniaguine | |
| 6,743,671 B2 | 6/2004 | Hu et al. | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,084,481 B2 | 8/2006 | Lowther et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,265,433 B2 * | 9/2007 | Pillai ..................... | H01L 24/05 257/531 |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,456,721 B2 * | 11/2008 | Chiu ..................... | H03H 7/42 336/200 |
| 7,485,912 B2 | 2/2009 | Wang | |
| 2005/0051871 A1 | 3/2005 | Lowther et al. | |
| 2008/0272875 A1 * | 11/2008 | Huang ................ | H01F 17/0013 336/182 |
| 2010/0141354 A1 | 6/2010 | Cho | |
| 2010/0164069 A1 * | 7/2010 | Jou ..................... | H01L 23/5227 257/547 |
| 2010/0164667 A1 * | 7/2010 | Ho-Hsiang ......... | H01F 17/0006 336/137 |
| 2010/0214041 A1 | 8/2010 | Cho | |
| 2011/0248811 A1 * | 10/2011 | Kireev ................ | H01L 23/5227 336/200 |

OTHER PUBLICATIONS

Unpublished U.S. Appl. No. 13/158,044, filed Jun. 10, 2011 entitled "A Vertical Interdigitated Semiconductor Capacitor," 33 pages.
Unpublished U.S. Appl. No. 13/212,982, filed Aug. 18, 2011 entitled "Vertically Oriented Semiconductor Device and Shielding Structure Thereof," 44 pages.
Unpublished U.S. Appl. No. 13/227,242, filed Sep. 7, 2011 entited "A Horizontal Interdigitated Capacitor Structor with Vias," 44 pages.
Unpublished U.S. Appl. No. 13/272,866, filed Oct. 13, 2011 entitled "Vertically Oriented Semiconductor Device and Shielding Structure Thereof," 38 pages.
Kawano, Yoichi, et al., "A 77GHz Transceiver in 90nm CMOS," 2009 IEEE International Solid-State Circuits Conference. 978-1-4244-3457-2/09, ISSCC 2009/Session 18/Ranging and Gb/s Communication/18.3, 3 pages.
Lim, Chee Chong, et al., "Fully Symmetrical Monolithic Transformer (True 1:1) for Silicon RFIC," IEEE Transactions on Microwave Theory and Techiques, vol. 56, No. 10, Oct. 2006, pp. 2301-2311.
Unpublished U.S. Appl. No. 13/212,987, filed Aug. 18, 2011 entitled "Vertically Oriented Semiconductor Device and Shielding Structure Thereof," 45 pages.
Unpublished U.S. Appl. No. 13/212,976, filed Aug. 18, 2011 entitled "Vertically Oriented Semiconductor Device and Shielding Structure Thereof," 44 pages.

* cited by examiner

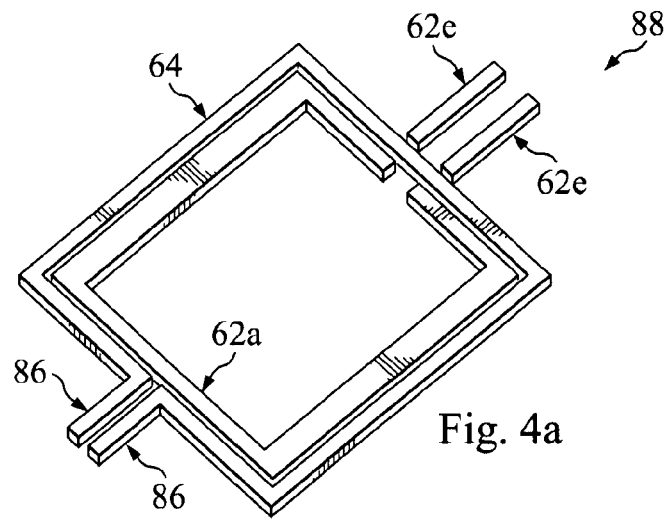
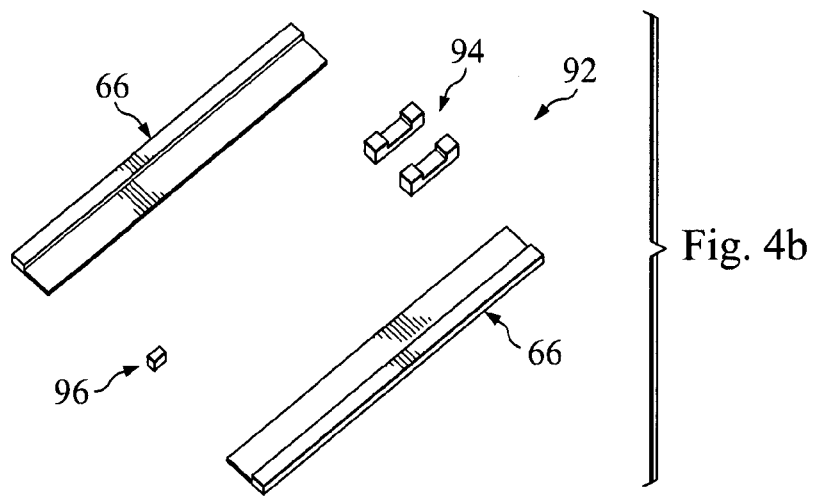
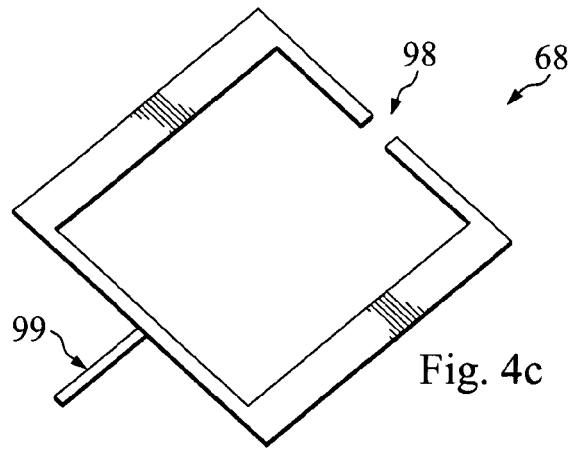
Fig. 4a
Fig. 4b
Fig. 4c

STRUCTURE AND METHOD FOR A HIGH-K TRANSFORMER WITH CAPACITIVE COUPLING

PRIORITY DATA

The present application is a divisional application of U.S. application Ser. No. 13/280,786, filed Oct. 25, 2011, which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Various active or passive electronic components can be formed on a semiconductor IC. For example, a transformer may be formed as a passive electronic component. As device sizes continue to decrease for even higher frequency applications, traditional transformer structures may encounter problems, such as reduced mutual inductive coefficient K and reduced self-resonant frequency. Particularly, when a transformer is applied with an electrical voltage having a high frequency up to 30 GHz, the mutual inductive coefficient drops to 0.6 or less. The self-resonant frequency also drops down with decreased device size by advancing technology nodes.

Therefore, while existing transformer devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 4a, 4b and 4c are perspective views of various features of the transformer in FIG. 4 according to various embodiments.

DETAILED DESCRIPTION

Figure 1:
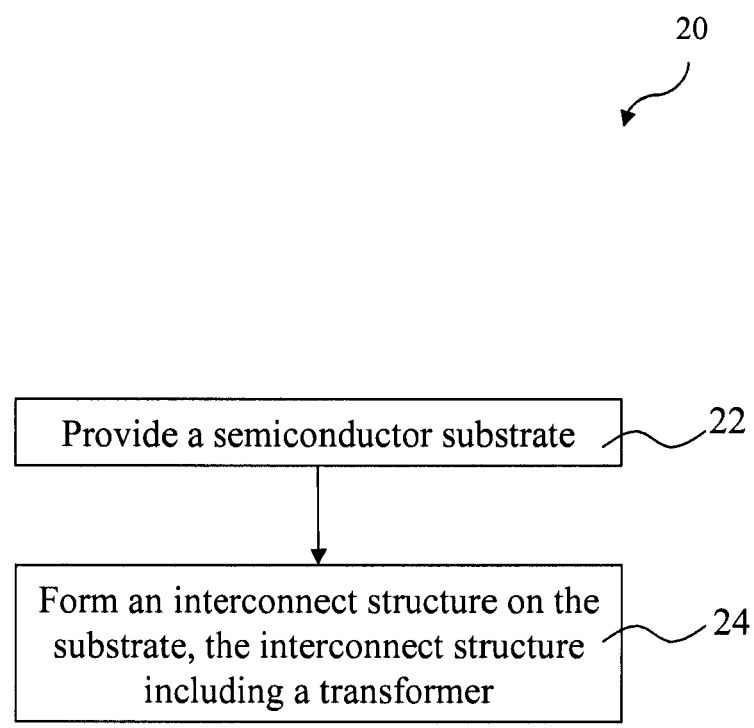
FIG. 1 is a flowchart of method to fabricate a semiconductor device having a transformer with capacitive coupling features in one or more embodiments.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
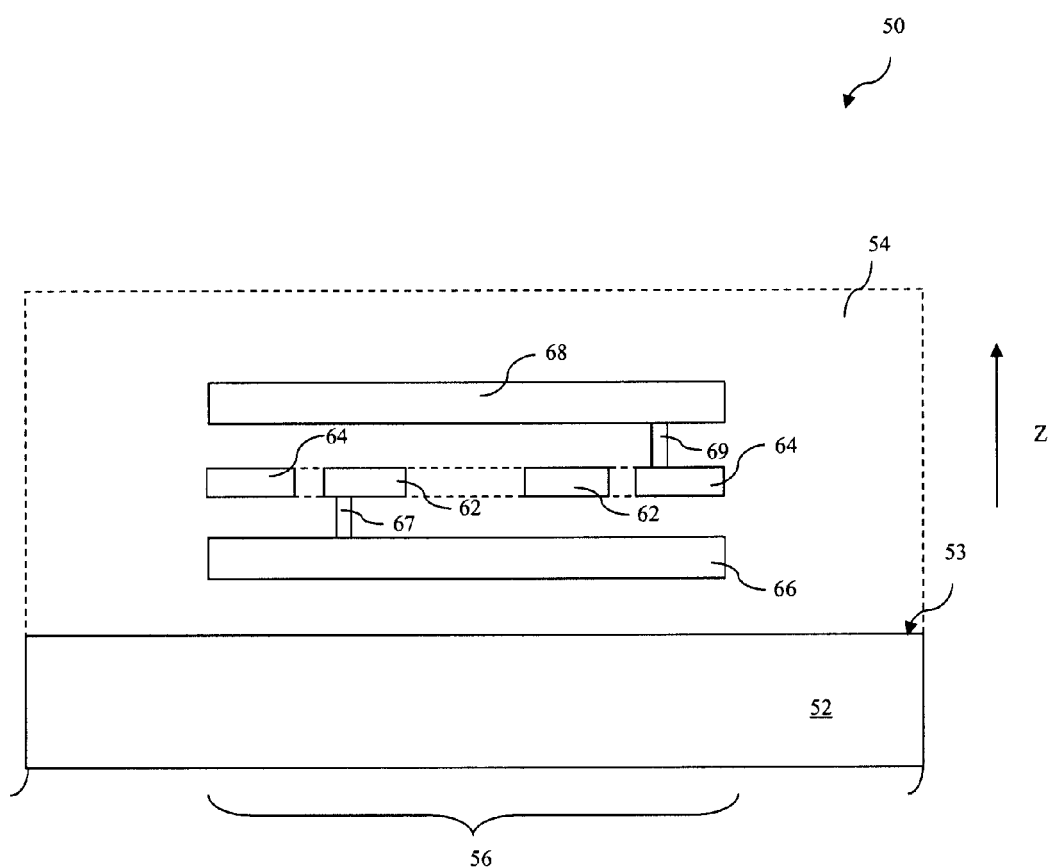
FIG. 2 is a schematic view of a semiconductor device having a transformer with capacitive coupling features constructed according to aspects of the present disclosure in one or more embodiments.

Illustrated in FIG. 1 is a flowchart of a method 20 for fabricating a semiconductor device that includes a transformer structure. FIG. 2 is a schematic view of a semiconductor structure 50 having a transformer with capacitive coupling features constructed according to aspects of the present disclosure in other embodiments. The semiconductor structure 50 and the method 20 are collectively described below with reference to FIGS. 1 and 2.

The semiconductor structure 50 may include an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. It is understood that the Figures discussed herein have been simplified for a better understanding of the inventive concepts of the present disclosure. Accordingly, it should be noted that additional processes may be provided before, during, and after the method 20 of FIG. 1, and that some other processes may only be briefly described herein.

The method 20 begins with block 22 in which a substrate 52 is provided. The substrate 52 includes a surface 53 that defines an axis "Z" perpendicular to the surface 53. The substrate 52 may include a semiconductor substrate, such as silicon substrate, or other suitable substrate. Alternatively or additionally, the substrate 52 includes germanium, silicon germanium or other proper semiconductor materials. The substrate 52 also includes various isolation features, such as shallow trench isolation (STI), formed in the substrate to separate various devices. The semiconductor substrate also includes various doped regions such as n-well, p-wells, light doped drain (LDD) features and heavily doped source and drain (S/D) features. Those doped features and other features (e.g., gate electrode) are configured to form various active and passive devices.

The method 20 begins with block 24 in which an interconnect structure 54 is formed on the substrate 52. The interconnect structure 54 includes a plurality of conductive lines interconnected by a plurality of vias (or via features). Particularly, the interconnect structure includes multiple metal layers, such as metal one $M_1$, metal two $M_2$ and so on. The metal layers are perpendicular to the axis Z. The plurality of conductive lines belong to respective metal layers. The conductive lines and via features are configured to provide horizontal and vertical routings, respectively. The conductive lines and via features are couple with the various devices on the substrate, forming one or more functional circuits. Furthermore, the interconnect structure is designed to provide electrical routings between the devices and input/output signals.

In another embodiment, each of the metal lines and via features further includes a barrier layer and bulk metal where the barrier layer is disposed to separate the bulk metal from the adjacent dielectric material. In one example, the barrier layer includes titanium nitride, tantalum nitride or other suitable material to prevent inter-diffusion between the bulk metal and the dielectric material. In another example, the bulk metal includes copper, aluminum (or aluminum copper alloy), tungsten or other suitable metal. In yet another example, the dielectric material includes silicon oxide, low k dielectric material or other dielectric material to provide isolation among various metal lines and via features.

The interconnect structure 54 is formed in a manner such that a transformer 56 is formed in the interconnect structure. The transformer 56 is formed with at least some of the conductive lines and at least some of the vias of the interconnect structure 54. In one embodiment, the transformer includes a first conductive feature (first inductive coupling feature or inductive conductive feature) 62 and a second conductive feature (second inductive coupling feature or second inductive conductive feature) 64 configured to be inductively coupled. Particularly, the first conductive feature 62 includes a first coil element and the second conductive feature 64 includes a second coil element. The first conductive feature 62 further includes first two ports extended from the first coil element and connected with one of input/output signals. Similarly, the second conductive feature 64 includes second two ports connected with another one of input/output signals. One of the first conductive feature 62 and second conductive feature 64 is configured as a primary coil of the transformer 56 and the another is configured as a secondary coil.

The transformer 56 defines a mutual inductance M between the first and second conductive features 62 and 64. A coupling coefficient K is defined to the transformer as well. The coupling coefficient K ranges between 0 and 1. The mutual inductance is related to the coupling coefficient K. In one example wherein the transformer 56 only includes the first and second inductive coupling features 62 and 64, the mutual inductance M is related to the coupling coefficient K by $M=K(L1*L2)^{1/2}$, wherein L1 is the self-inductance of the first coil element and L2 is the self-inductance of the second coil element.

The first and second conductive features 62 and 64 are integrated in one or more metal layers and are approximate from each other such that the mutual inductance is enhanced. In one embodiment, the first and second conductive features 62 and 64 are substantially configured in a same metal layer or same two metal layers. In one embodiment, the first and second conductive features 62 and 64 are configured in two approximate metal layers and each may include metal lines in the two metal layers and via features between the two metal layers. In furtherance of the embodiment, the first and second coil elements are configured one metal layer and the first and second ports are distributed on the two metal layers. In another embodiment, the first conductive feature 62 and second conductive feature 64 each include multiple turns and are configured to be inter-wound with each other to enhance the mutual inductance. In another embodiment, the first conductive feature 62 and second conductive feature 64 each include one turn and are configured such that the second conductive feature 64 surrounds the first conductive feature 62 in a top view. In an alternative embodiment, the first conductive feature 62 and second conductive feature 64 each include one turn and are configured such that the first conductive feature 62 surrounds the second conductive feature 64 in a top view.

The transformer 56 further includes a third conductive feature (first capacitive coupling feature or capacitive conductive feature) 66 approximate to the first conductive feature 62 and is electrically connected to the first conductive feature 62 through one or more via feature 67. The third conductive feature 66 is designed and configured to provide a capacitive coupling between the primary coil and the secondary coil. Particularly, the third conductive feature 66 is capacitively coupled with the second conductive feature 64 and thus further increase the mutual inductance M and the coupling coefficient K through the capacitive coupling. In one embodiment, the third conductive feature 66 is substantially aligned with the first and second conductive features 62 and 64 in the top view, enhancing the capacitive coupling effect. In another embodiment, the third conductive feature 66 is configured between the substrate 52 and the conductive features 62/64 to additionally shield the transformer 56 from the substrate 52, reducing the magnetically induced loss on the substrate 52.

In another embodiment, the transformer 56 further includes a fourth conductive feature (second capacitive coupling feature or capacitive conductive feature) 68 approximate to the second conductive feature 64 and is electrically connected to the second conductive feature 64 through one or more via feature 69. The fourth conductive feature 68 is designed and configured to provide additional capacitive coupling between the primary coil and the secondary coil. Particularly, the fourth conductive feature 68 is capacitively coupled with the first conductive feature 62 and thus further increase the mutual inductance M and the coupling coefficient K through the respective capacitive coupling. In one embodiment, the fourth conductive feature 68 is substantially aligned with the conductive features 62 and 64 in the top view to enhance the capacitive coupling effect. In another embodiment, the fourth conductive feature 68 is configured overlying the conductive features 62 and 64 to further provide a shielding effect for shielding the transformer 56 from other portions of the interconnect structure 54. Alternatively, the fourth conductive feature 68 is disposed between the third conductive feature 66 and the substrate 52.

The third and fourth conductive features 66 and 68 are designed and configured for capacitive coupling effect, increasing the mutual inductance M and the coupling coefficient K of the transformer 56. In one embodiment, each of the third and fourth conductive features 66 and 68 is designed to have a large enough conducive area for capacitive coupling, but each has a geometry that substantially reduces the eddy current (therefore reduced inductive coupling). In furtherance of the embodiment, each of the third and fourth conductive features 66 and 68 has an open structure with at least two floating ends and therefore the eddy current is eliminated or reduced. In another embodiment, the third and fourth conductive features 66 and 68 are disposed within a same region of the substrate 52 and substantially overlap with each other, in the top view, to increase the capacitive coupling area. In yet another embodiment, the third and fourth conductive features 66 and 68 are configured to sandwich the first and the second conductive features (coil elements) 62 and 64. In another embodiment, the third and fourth conductive features 66 and 68 are alternatively configured such that the third conductive feature 66 is coupled with the second conductive feature 64 and the fourth conductive feature 68 is coupled with the first conductive feature 62.

In one embodiment, each of the first and second conductive features 62 and 64 is disposed on both first and second metal layers, the third conductive feature 66 is disposed on a third metal layer and the fourth conductive feature 68 is disposed on a fourth metal layer. In one example, the third metal layer is below the first and second metal layers and the fourth metal layer is above the first and second metal layers. In another example, the third metal layer is below the first and second metal layers and the fourth metal layer is below the third metal layer. In another example, at least one of the third and fourth conductive features 66 and 68 is electrically grounded. In another example, at least one of the third and fourth conductive features 66 and 68 is electrically floating. In another embodiment, only one of the third and fourth conductive features is present and another one is eliminated from the transformer.

Although not specifically shown for the sake of simplicity, the interconnect structure 54 further includes one or more dielectric material layers such that the various metal features (metal lines and via features) are embedded in. The dielectric material layers provide isolation function to the interconnect structure. The dielectric material layers may include silicon oxide, silicon nitride, silicon oxy-nitride, un-doped silicate (USG), fluoride-doped silicate (FSG), and/or a low-k dielectric material. The various interconnection features may implement various conductive materials including copper, tungsten, aluminum or silicide. In one example, a damascene process is used to form copper related interconnect structure. In another example, a metal etch process may be used to form aluminum related interconnect structure.

Figure 3:
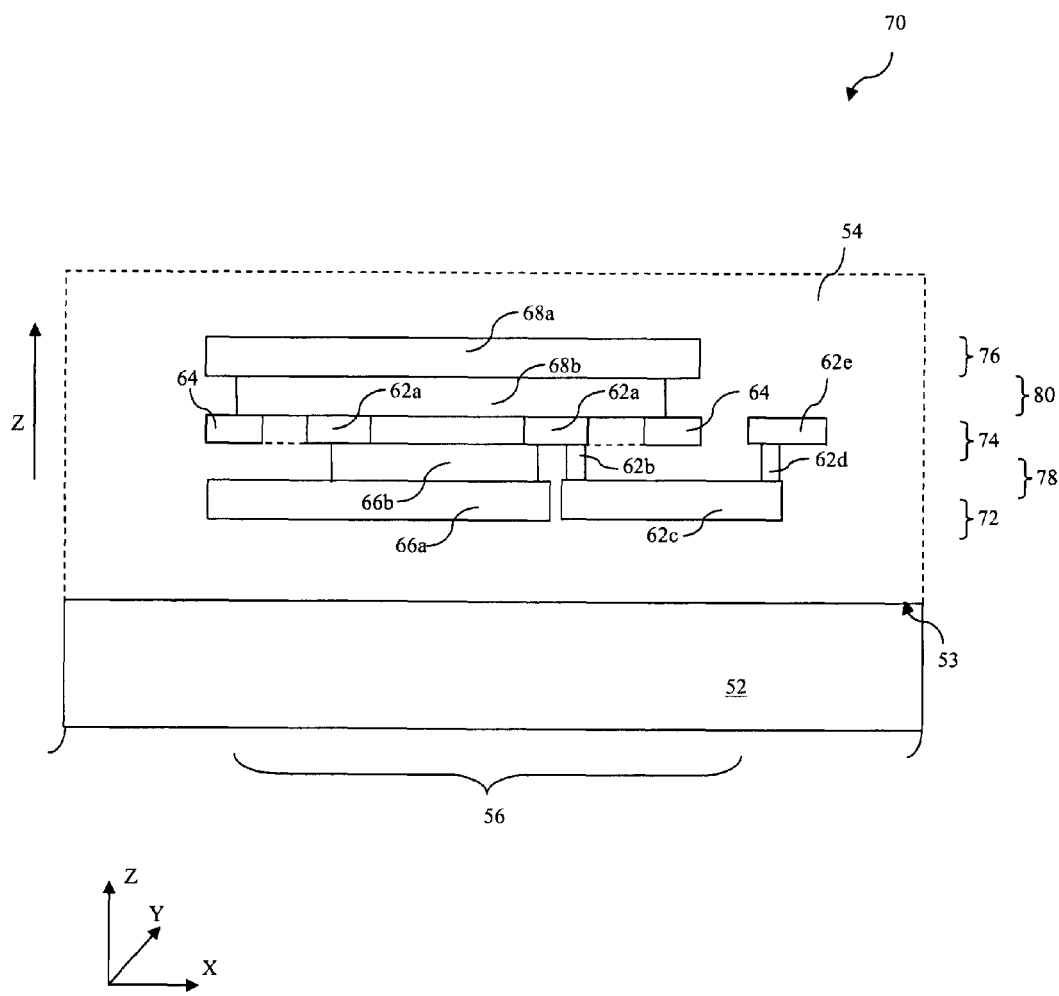
FIG. 3 is a sectional view of a semiconductor device having a transformer with capacitive coupling features constructed according to aspects of the present disclosure in other embodiments.

Various embodiments of the transformer are illustrated below with reference to respective figures and further described. FIG. 3 is a sectional view of a semiconductor device 70 having a transformer constructed according to various aspects in one or more embodiments. The semiconductor device 70 includes a transformer 56 integrated in the interconnect structure 54. In the depicted embodiment, the interconnect structure 54 includes three consecutive metal layers 72, 74 and 76. Particularly, the metal layer 74 is disposed on the metal layer 72 and the metal layer 76 is disposed on the metal layer 74. The interconnect structure 54 further includes a first via layer 78 and a second via layer 80. The first via layer 78 includes a plurality of via features between the metal layers 72 and 74, and the second via layer 80 includes a plurality of via features between the metal layers 74 and 76. The transformer 56 is formed in the consecutive metal layers (72, 74 and 76) and the via layers (78 and 80).

Figure 3A:
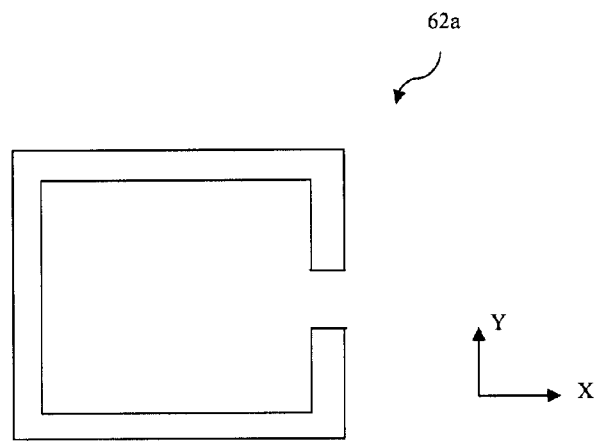
FIGS. 3a, 3b, 3c and 3d are top views of various features in the transformer of FIG. 3 constructed according to various aspects of the present disclosure in various embodiments.

The transformer 56 includes a first conductive feature 62 and a second conductive feature 64 configured to be inductively coupled. The first conductive feature 62 includes a first coil element. The first conductive feature 62 further includes first two ports extended from the first coil element and connected with one of input/output signals. Particularly, the first conductive feature 62 includes metal lines 62a and 62e in the metal layer 74; metal lines 62c in the metal layer 72; and the via features 62b and 62d in the first via layer 78. The metal lines 62a define a coil structure as the first coil element. The metal lines 62e form two ports of the first conductive feature 62 and are connected to the first coil element through via features 62d, metal lines 62c and via features 62b. FIG. 3a illustrates the metal lines 62e as the first coil element in a top view toward the substrate 52. Two directions (or axis) X and Y are defined on the substrate 52 and are perpendicular to each other. Both directions X and Y are further perpendicular to the axis Z. The axis X and Y define a plane parallel to the surface 53 of the substrate 52.

Figure 3B:
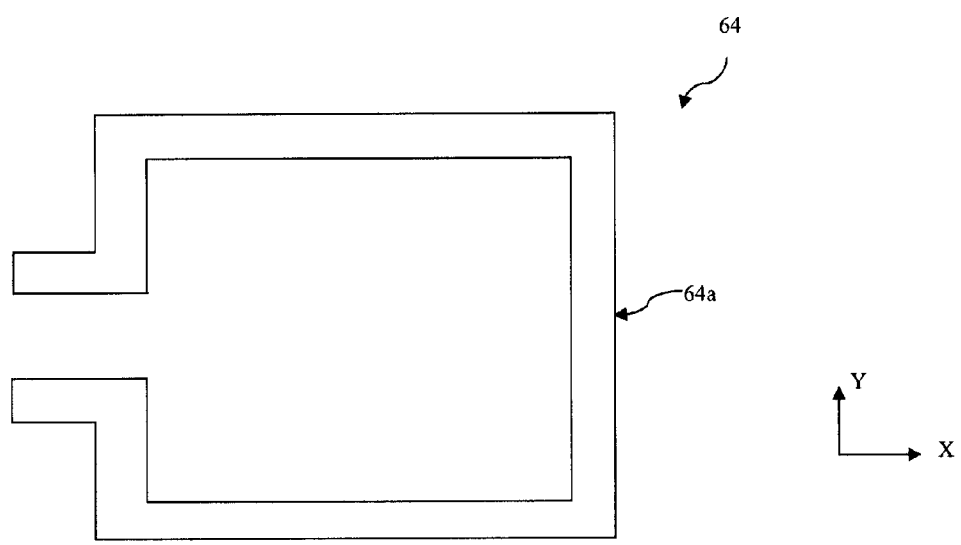

Similarly, the second conductive feature 64 includes a second coil element disposed in the metal layer 74 and is further illustrated in FIG. 3b as a top view. The second conductive feature 64 further includes second two ports extended from the second coil element and connected with another one of input/output signals. In one embodiment, the conductive feature 64 may be connected to a voltage source or a ground line, such as through the central portion 64a of the conductive feature 64. The second coil element and the second two ports include various metal lines properly configured and disposed in the metal layer 74. One of the first and second conductive features 62 and 64 is configured as a primary coil and the another is configured as a secondary coil. The transformer 56 defines a mutual inductance between the primary and secondary coils.

The transformer 56 further includes a third conductive feature 66 electrically connected to the first conductive feature 62. The third conductive feature 66 is designed and configured to provide a capacitive coupling to the transformer 56 and to increase the mutual inductance by the capacitive coupling. The third conductive feature 66 is disposed on the metal layer 72 between the substrate 52 and the two coil elements. The third conductive feature 66 includes metal strips 66a in the metal layer 72 and further includes connecting features 66b (such as one or more via features) to connect the metal strips 66a to the first coil element. In one example, the connecting features 66b include conventional via features. In the depicted embodiment, the connecting features 66b include an elongated via feature oriented such that to increase the contact areas with the first coil element and the metal strips 66a.

Figure 3C:
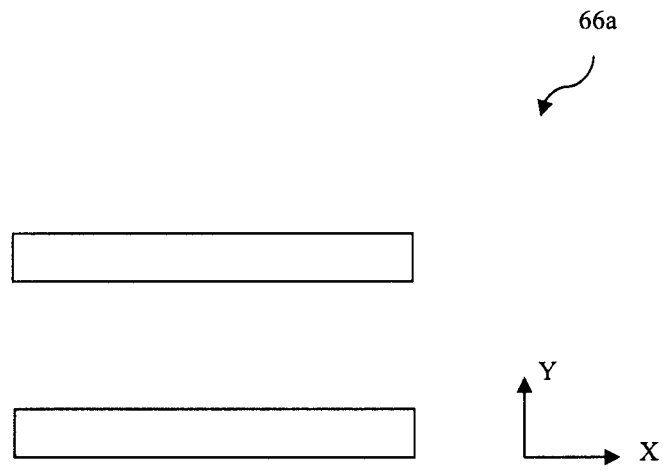

The metal strips 66a as a portion of the third conductive feature 66 is further illustrated in FIG. 3c in a top view. The metal strips 66a do not form a closed path in order to reduce or eliminate eddy currents induced therein, thus enhancing the capacitive coupling. In one embodiment, the metal strips 66a include two or more free (floating) ends. The metal strips are oriented along the direction of the corresponding segments of the first coil element. Furthermore, the via features 66b are oriented in the same direction and are aligned with the corresponding segments of the first coil element and the respective metals trips 66a for connecting the metal strips 66a to the first coil element. In the depicted embodiment, the metal strips 66a include two metal strips oriented along the Y axis. The metal strips 66a may have width similar to the width of other metal lines in the same metal layer or greater than that to increase capacitive coupling area. For example, the metal strips has a width ranging from about 5 times to about 10 times of the width of the other metal lines in the same metal layer. In another example, the metal strips has a width ranging from about 5 times to about 10 times of the width of the metal lines in the first and second coil elements.

The transformer 56 further includes a fourth conductive feature 68 electrically connected to the second conductive feature 64. The fourth conductive feature 68 is designed and configured to further provide a capacitive coupling to the transformer 56. The fourth conductive feature 68 is disposed on the metal layer 76 overlying the two coil conductors. The fourth conductive feature 68 includes metal lines in the metal layer 76 and is connected to the second conductive feature 64 through one (or more) via feature 68b. In one example, the via feature 68b includes an elongated via feature oriented to have increased contact areas with the conductive feature 64.

Figure 3D:
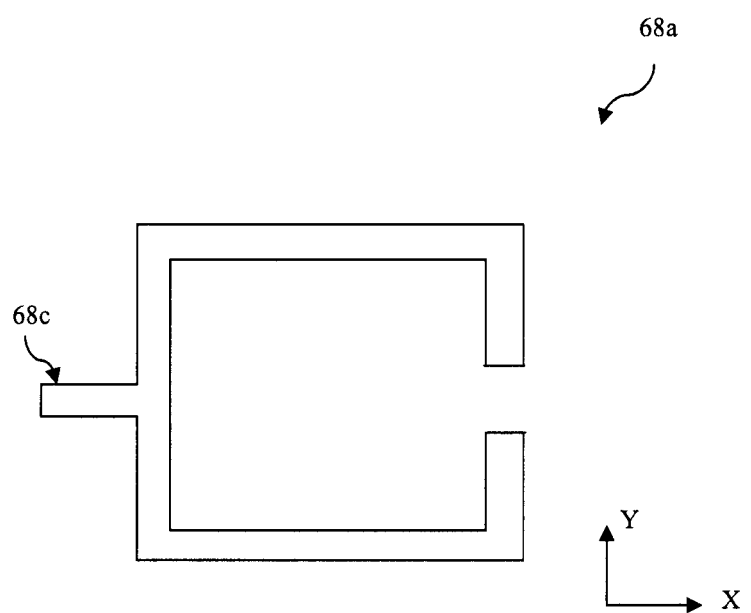

The metal strips 68a as a portion of the fourth conductive feature 68 is further illustrated in FIG. 3d in a top view. The metal strips 68a do not form a closed path to reduce or eliminate eddy currents, thus enhancing the capacitive coupling. In one embodiment, the metal strips 68a include two or more free (floating) ends. In another embodiment, the metal strips 68a may be connected to a voltage source or a ground line, such as through a portion 68c of the conductive feature 68a. The metal strips 68a are oriented along the direction of the corresponding segments of the second coil element. Furthermore, the via features 68b are oriented in the same direction and are aligned with the corresponding segments of the second coil element and the respective metals trips 68a for connecting the metal strips 68a to the second coil element. In the depicted embodiment, the metal strips 68a include various segments configured to substantially overlap with the second coil element. In furtherance of the embodiment, the various segments are connected without forming a closed path. The metal strips 68a may have width similar to the width of other metal lines in the same metal layer or greater than that to increase capacitive coupling area. For example, the metal strips has a width ranging from about 5 times to about 10 times of the width of other metal lines in the same metal layer. In another example, the metal strips has a width ranging from about 5 times to about 10 times of the width of the metal lines in the first and second coil elements.

In one embodiment, the fourth conductive feature 68 is alternatively disposed under the third conductive feature 66. In another embodiment, the metal strips 66a may be designed differently, such as with a geometry similar to the one in FIG. 3d. In another embodiment, the metal strips 68a may be designed differently, such as with a geometry similar to the one in FIG. 3c.

Furthermore, the first, second, third and fourth conductive features are disposed within a same region of the substrate 52 such that they are substantially aligned and overlapped in the top view, enhancing respective inductive coupling and capacitive coupling effects. The third and fourth conductive features 66/68 are configured to sandwich the first and second conductive features 62 and 64 for shielding effect, reducing the magnetically induced loss on the substrate 52 and/or on other portions of the interconnect structure 54.

Figure 4:
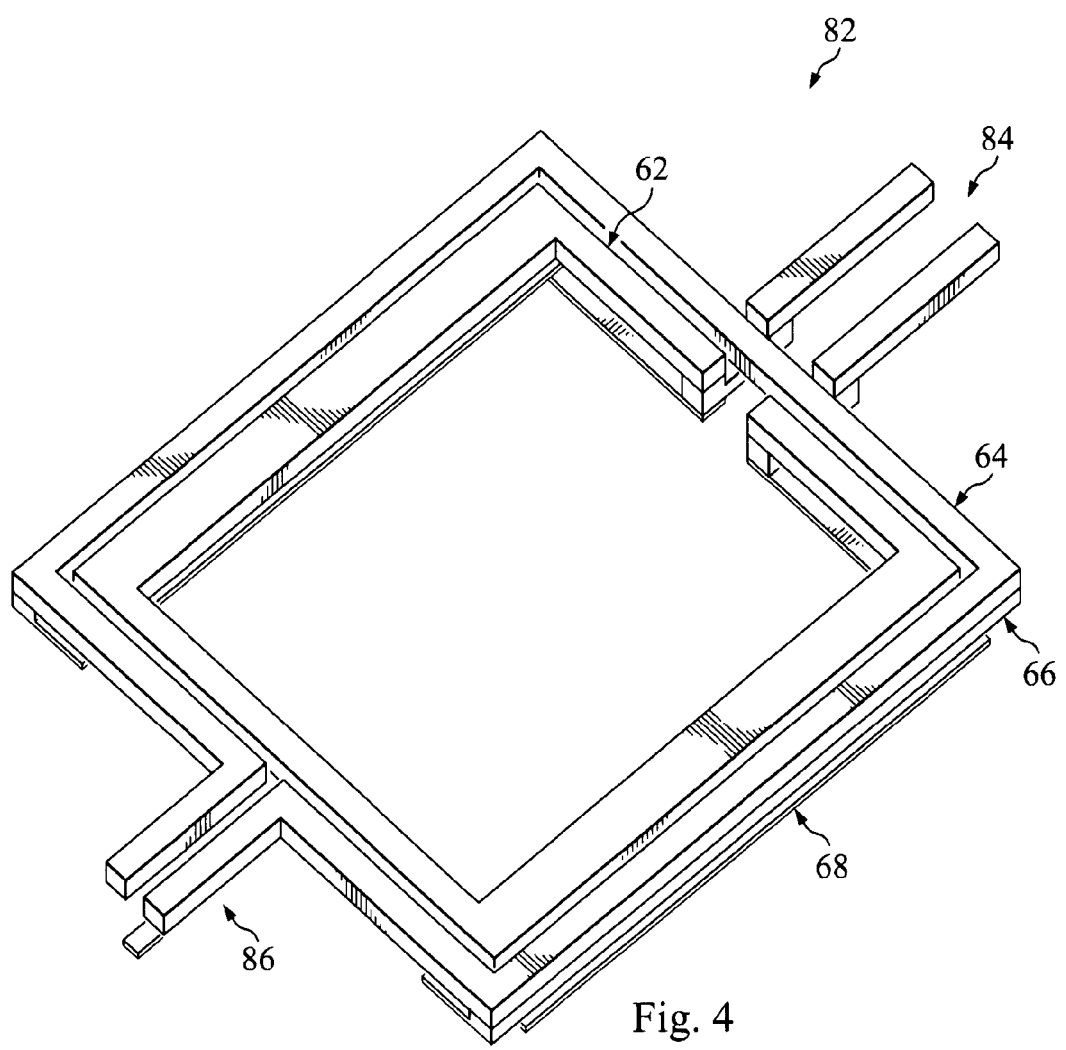
FIG. 4 is a perspective view of a transformer with one or more capacitive coupling features according to one or more embodiments.

FIG. 4 is a diagrammatic view of a transformer 82 as an embodiment of the transformer 56 in FIG. 2 or the transformer 70 in FIG. 3, integrated in the interconnect structure 54. The transformer 82 includes a first conductive feature 62 and a second conductive feature 64 configured to be inductively coupled. Particularly, the first conductive feature 62 includes a first coil element and the second conductive feature 64 includes a second coil element. The first conductive feature 62 further includes first two ports 84 connected with one of input/output signals. Similarly, the second conductive feature 64 further includes second two ports 86 connected with another one of input/output signals. The transformer 82 defines a mutual inductance. One of the first conductive feature 62 and second conductive feature 64 is configured as a primary coil for the transformer 56 and the another one is configured as a secondary coil.

The transformer 82 further includes a third conductive feature 66 approximate to the first conductive feature 62; underlying the first and second conductive features 62 and 64; and is electrically connected to the first conductive feature 62. The third conductive feature 66 is designed and configured to provide a capacitive coupling between the primary coil and the secondary coil, increasing the mutual inductance by the capacitive coupling.

The transformer 82 further includes a fourth conductive feature 68 approximate to the second conductive feature 64 and is electrically connected to the second conductive feature 64 through via feature and metal lines. In the present embodiment, the fourth conductive feature 68 is disposed underlying the third conductive feature 66 and is designed and configured to provide additional capacitive coupling between the primary coil and the secondary coil.

The transformer 82, including the first, second, third and fourth conductive features (62, 64, 66 and 68), are formed in three consecutive metal layers. Various via features are formed and configured to connect neighboring metal layers. Various portions of the transformer 82 are further illustrated in FIGS. 4a, 4b and 4c, respectively, as diagrammatic views with further description.

FIG. 4a illustrates a first portion of the transformer 82 in a first metal layer 88 including various metal lines 62a, 62e, 64 and 90. The metal lines 62a form a first coil element. The first two ports 84 of the first conductive feature 62 include the metal lines 62e and further include other conductive features (linking features 94) to enable a proper connection to the first coil element. The metal lines 64 form a second coil element. Second two ports 86 are connected to the second coil element. The first coil element is surrounded by the second coil element.

FIG. 4b illustrates a second portion 92 of the transformer 82, including metal lines in a second metal layer and via features between the first and second metal layer. The second portion 92 includes the third conductor features 66, two linking features 94 and another linking feature 96. The third conductor feature 68 includes two metal strips and elongated via features landing on respective metal strips. The two linking features 94 include metal lines and via features configured to connect the metal lines 62e to the first coil element. The two linking features 94 and the metal lines 62e form the first two ports 84. The linking feature 96 includes a metal line and a via feature (below and above the respective metal line) configured to connect the fourth conductive feature 68 to the second coil element.

FIG. 4c illustrates a third portion of the transformer 82 as the fourth conductive feature 68 electrically connected to the second coil element through the linking feature 96. The fourth conductive feature 68 does not form a closed path. For example, the fourth conductive feature 68 includes two floating ends, defining an opening 98. Alternatively, the fourth conductive feature 68 may be connected with a voltage source or a ground line, such as through a portion 99 of the fourth conductive feature 68.

Alternatively, the linking feature 96 is configured to connect the fourth conductive feature 68 to the first coil element and the third conductive feature 66 are connected to the second coil element. In yet another alternative embodiment, each of the first and second may include more than one turns configured in multiple metal layers. In yet another embodiment, each of the third and fourth conductive features may be configured in multiple metal layers but does not form a closed path. In yet another alternative embodiment, the linking feature 96 and the fourth conductive feature 68 may be eliminated from the transformer 82.

Figure 5:
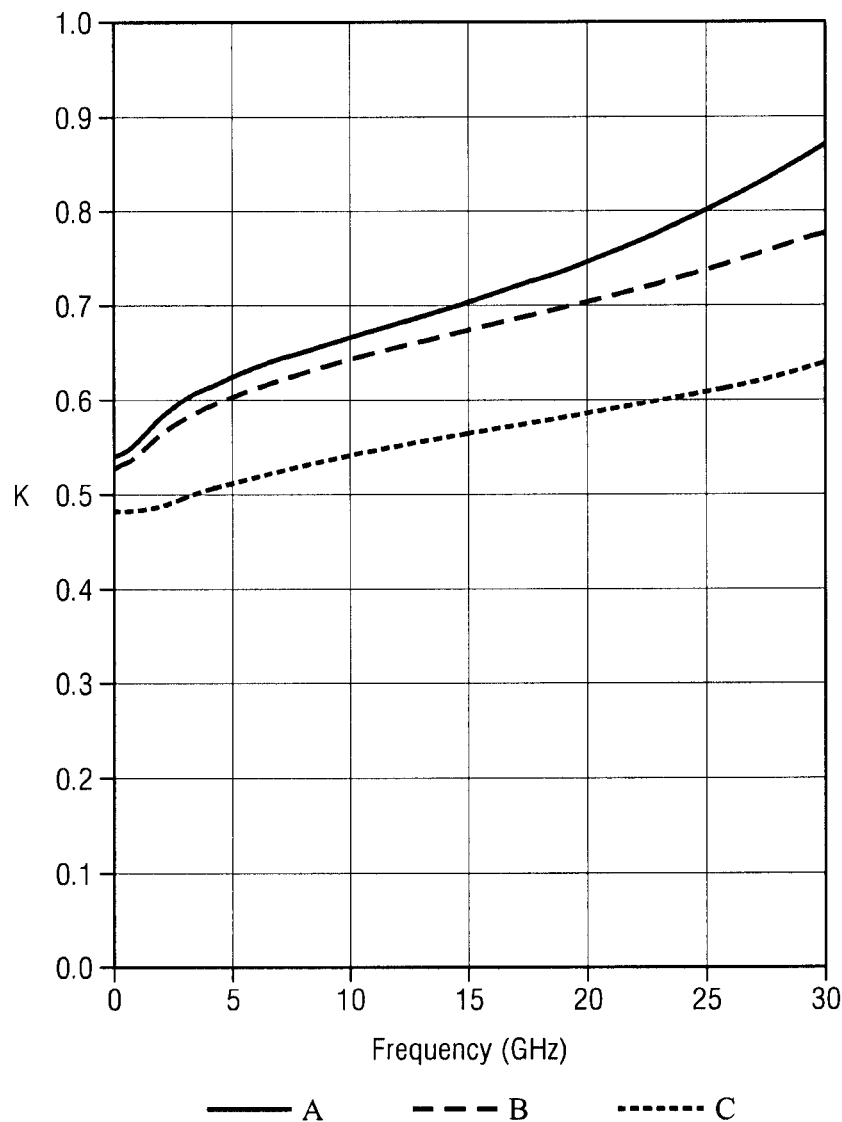
FIG. 5 is a diagram of various characteristic data of a transformer having one or more capacitive coupling feature.

FIG. 5 is a diagram of various characteristic data of a semiconductor device having a transformer with one or more capacitive coupling features in various examples. The horizontal axis represents the frequency (GHz) of a signal applied to the primary coil element. The vertical axis represents the coupling coefficient "K" of a transformer. The various data are from various examples. A first set of data labeled as "A" are from a transformer, such as one embodiment of the transformer 50 in FIG. 2, the transformer 70 in FIG. 3 or the transformer 82 in FIG. 4. Particularly, the transformer includes the first, second, third and fourth conductive features 62, 64, 66 and 68. A second set of data labeled as "B" are from a transformer, such as another embodiment of the transformer 50 in FIG. 2. Particularly, the transformer includes the first, second and third conductive features 62, 64 and 66. A third set of data labeled as "C" are from a transformer with only the first and second conductive features 62 and 64. However, the transformer does not include the third and fourth conductive features 66 and 68. From the diagram, the coupling coefficient K is increased (from "C" to "B") when the third conductive feature 66 is added to a transformer according to one example. The coupling coefficient K is further increased (from "B" to "C") when both the third conductive feature 66 and the fourth conductive feature 68 are added to a transformer according to anther example. According to the provided example, the coupling coefficient of a transformer may be increased by about 30% (form "C" to "A") when both the third conductive feature 66 and the fourth conductive feature 68 are added to the transformer.

Figure 6:
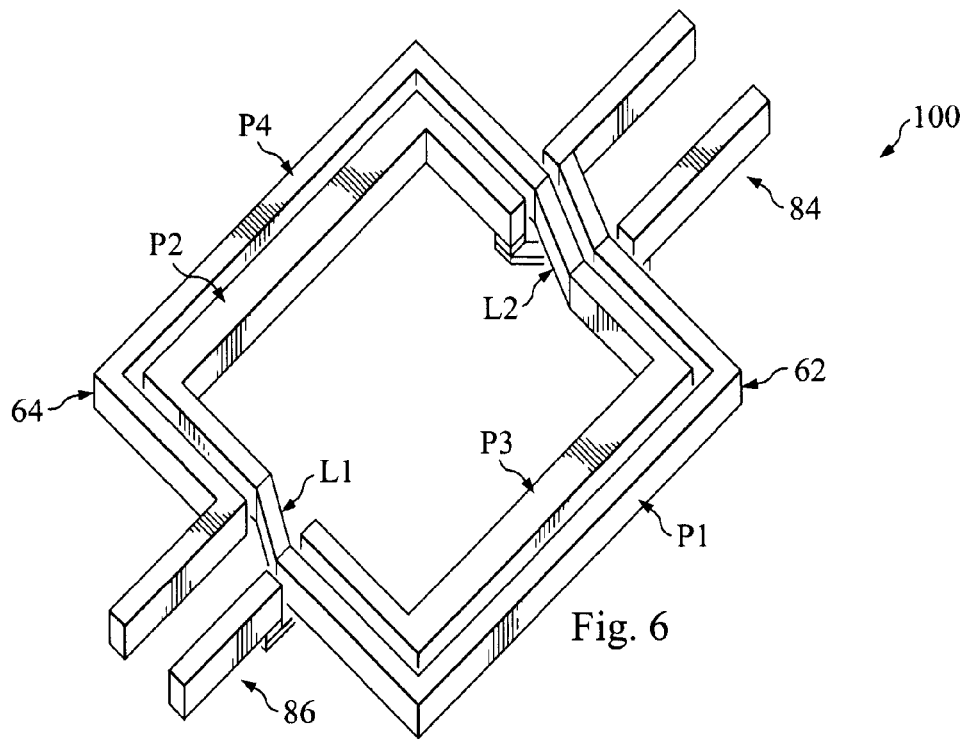
FIGS. 6 and 7 are perspective views of a transformer in various embodiments.
Figure 7:
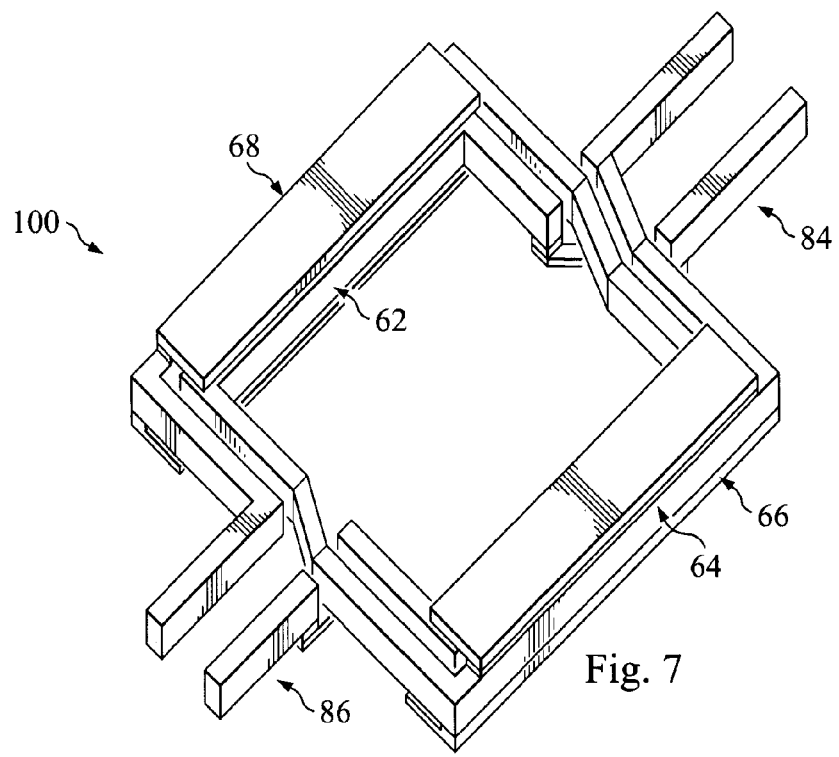

Although various embodiments are described, other embodiments of the transformer with additional capacitive coupling may be used according to the present disclosure. FIGS. 6 and 7 are diagrammatic fragmentary perspective views of a transformer 100 in another embodiment. FIG. 6 only shows the first and second conductive features 62 and 64 that may be incorporated into the transformer 50, 70 or 82 in FIGS. 3, 4 and 5, respectively. The first and second coil elements are inductively coupled but are differently configured. The first coil element and the second coil element are disposed in a same metal layer. Furthermore, the first two ports 84 and the second two ports 86 are respectively connected to the first and second coil elements in a different configuration. Particularly, the first coil element includes a first portion (P1) and a second portion (P2) and the second coil element includes a third portion (P3) and a fourth portion (P4) configured such that the first portion and the fourth portion substantially surround the second portion and the third portion inside in a top view. The first and second portions are connected through a first linking feature L1 and the third and fourth portions are connected through a second linking feature L2. One of the first two ports 84 is connected to the first coil element through an underlying metal layer and a via feature. One of the second two ports 86 is connected to the second coil element through the underlying metal layer and another via feature. One of the first and second conductive features 62 and 64 is the primary coil element and the another one is the secondary coil element.

The semiconductor device 100 in FIG. 7 includes the third conductive feature 66 and the fourth conductive feature 68 to provide capacitive coupling to the transformer and increase the mutual inductance thereof through the capacitive coupling. The third conductive feature 66 and the fourth conductive feature 68 are designed and configured similar to the third conductive feature 66 and the fourth conductive feature 68 in FIG. 4. Particularly, the third conductive feature 66 is electrically connected to the first conductive feature 62 and the fourth conductive feature 68 is electrically connected to the second conductive feature 64. In alternative embodiment, the semiconductor device 100 may only include one of the third conductive feature 66 and the fourth conductive feature 68.

Figure 8:
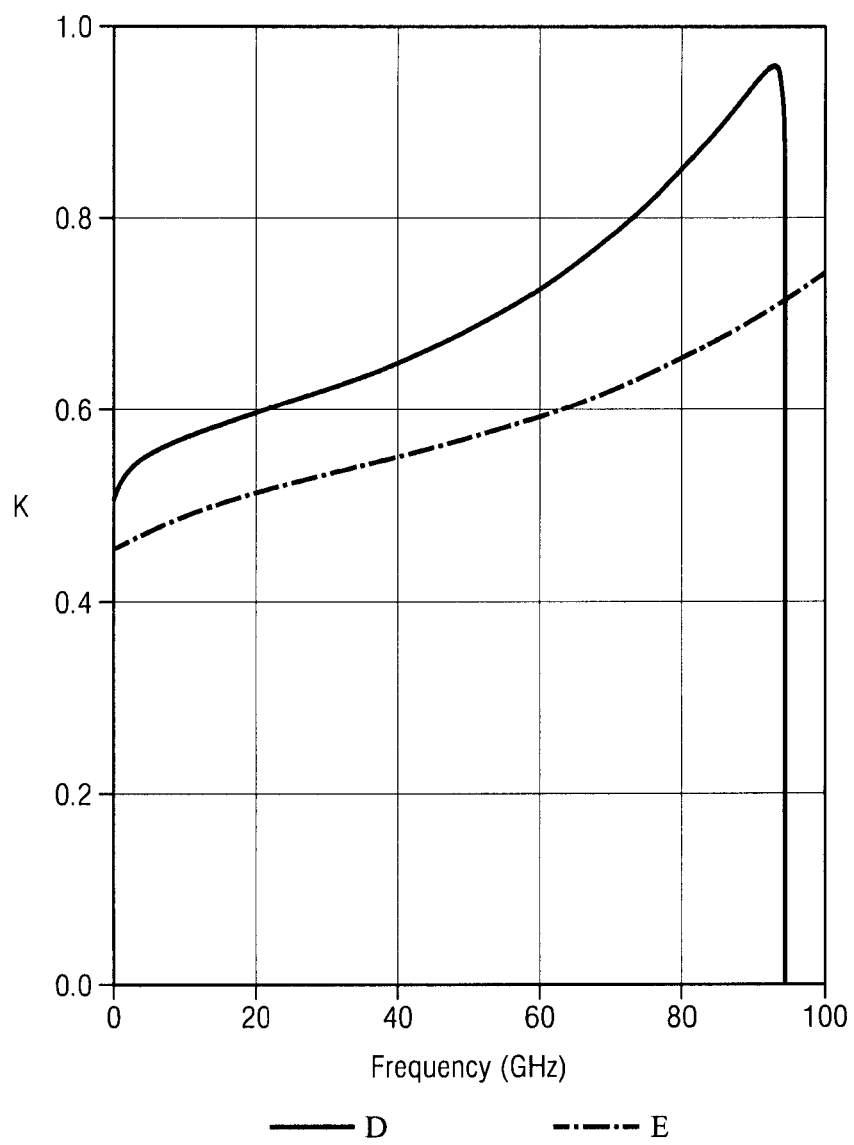
FIG. 8 is a diagram of various characteristic data of the transformer in FIG. 7.

FIG. 8 is a diagram of various characteristic data of the semiconductor device 100 having a transformer with capacitive coupling features according to one or more embodiments. The horizontal axis represents the frequency (GHz) of a signal applied to the primary coil element. The vertical axis represents the coupling coefficient "K" of a transformer. The various data are from various examples. A first set of data labeled as "D" are from the transformer 100 according to one embodiment in which the transformer includes only the third conductive feature 66. Particularly, the transformer includes the first, second and third conductive features 62, 64 and 66. A second set of data labeled as "E" are from a transformer with only the first and second conductive features 62 and 64 without any of the third and fourth conductive features 66 and 68 for capacitive coupling. From the diagram, the coupling coefficient K of the transformer with capacitive coupling feature is increased. According the provided example, the mutual inductance of the transformer 100 with one of third and fourth conductive features 66 and 68 has a coupling coefficient K increased up to about 0.73 at the frequency 60 GHz.

Figure 9:
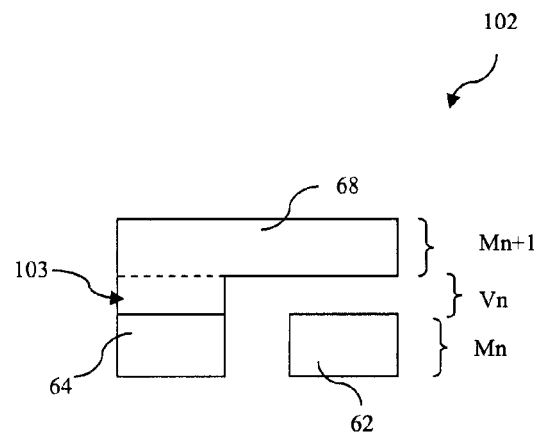
FIGS. 9-13 are sectional views of a transformer, in portion, with capacitive coupling according to various embodiments.

FIGS. 9 through 13 are fragmental sectional views of a transformer 102 having one or more capacitive coupling features constructed according to various embodiments. The transformer 102 may be incorporated in the semiconductor structure 70 of FIG. 3 or the semiconductor structure 50 of FIG. 2, for examples. The transformer 102 in FIG. 9 includes the first and second conductive features inductively coupled and further includes one capacitive coupling feature 68. In FIG. 9, the transformer 102 is disposed in two metal layers ($M_n$ and $M_{n+1}$) and a layer of via features ($V_n$) between $M_n$ and $M_{n+1}$. The first conductive feature 62 and the second conductive feature 64 are disposed on the metal layer $M_n$. The capacitive conductive feature 68 is disposed on the metal layer $M_{n+1}$ overlying the metal layer $M_n$. The capacitive conductive feature 68 is electrically connected to the second conductive feature 64 through one or more via feature 103 in the layer of via features $V_n$.

Figure 10:
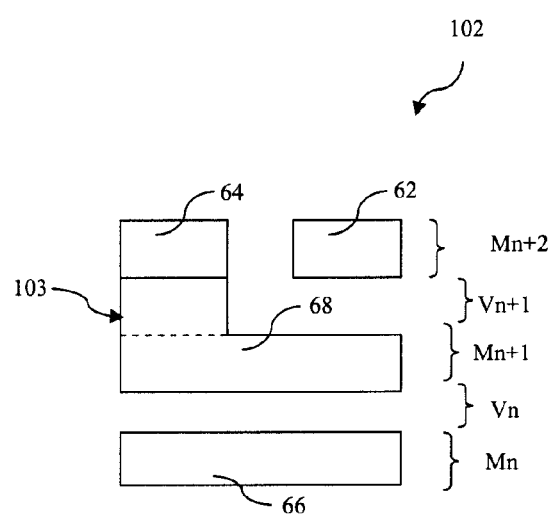

The transformer 102 in FIG. 10 includes the first and second conductive features 62 and 64 inductively coupled and further includes the third and fourth conductive features 66 and 68 to provide capacitive coupling and increase the mutual inductance or the coupling coefficient of the transformer 102. In FIG. 10, the transformer 102 is disposed in three metal layers ($M_n$, $M_{n+1}$ and $M_{n+2}$) and two via layers ($V_n$ and $V_{n+1}$). The first conductive feature 62 and the second conductive feature 64 are disposed on the metal layer $M_{n+2}$. The capacitive conductive feature 68 is disposed on the metal layer $M_{n+1}$ underlying the metal layer $M_{n+2}$. The capacitive conductive feature 68 is electrically connected to the second conductive feature 64 through one or more via feature 103 in the layer of via features. The capacitive conductive feature 66 is disposed on the metal layer $M_n$ underlying the metal layer $M_{n+1}$. The capacitive conductive feature 66 may be electrically grounded. The capacitive conductive feature 66 may be further electrically connected to or disconnected from the first conductive feature 62.

Figure 11:
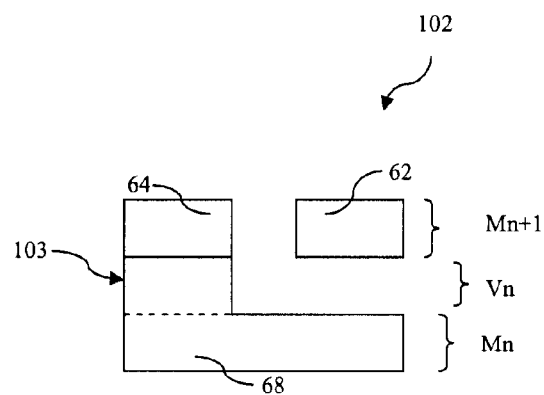

The transformer 102 in FIG. 11 includes the first and second conductive features inductively coupled and further includes one capacitive coupling feature 68. In FIG. 11, the transformer 102 is disposed in two metal layers ($M_n$ and $M_{n+1}$) and a layer of via features ($V_n$) between $M_n$ and $M_{n+1}$. The first conductive feature 62 and the second conductive feature 64 are disposed on the metal layer $M_{n+1}$. The capacitive conductive feature 68 is disposed on the metal layer $M_n$ underlying the metal layer $M_{n+1}$. The capacitive conductive feature 68 is electrically connected to the second conductive feature 64 through one or more via feature 103 in the layer of via features $V_n$.

Figures 12, 13:
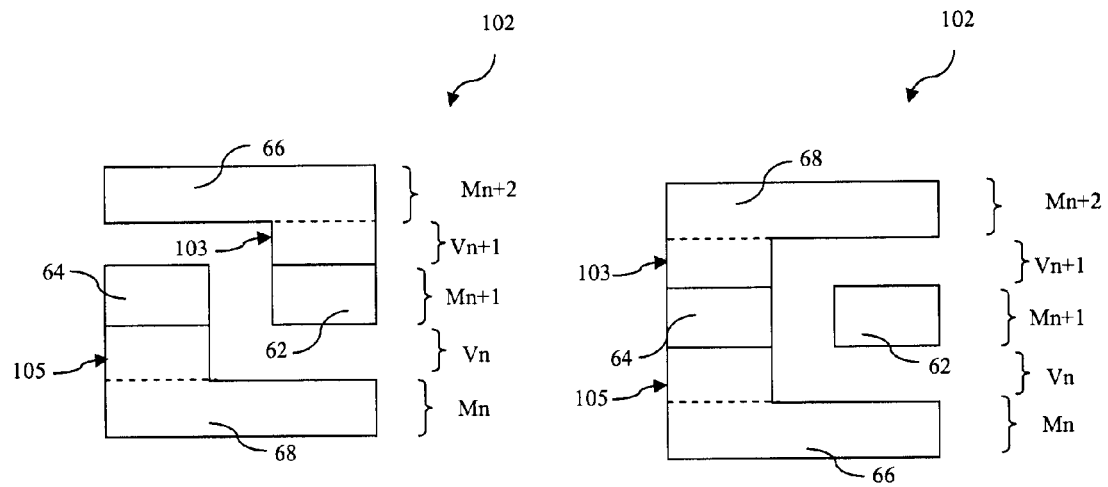

The transformer 102 in FIG. 12 includes the first and second conductive features inductively coupled and further includes the third and fourth conductive features 66 and 68 to provide capacitive coupling and increase the mutual inductance of the transformer 102. In FIG. 12, the transformer 102 is disposed in three metal layers ($M_n$, $M_{n+1}$ and $M_{n+2}$) and two layers of via features ($V_n$ and $V_{n+1}$). The first conductive feature 62 and the second conductive feature 64 are disposed on the metal layer $M_{n+1}$. The capacitive conductive feature 66 is disposed on the metal layer $M_{n+2}$ overlying the metal layer $M_{n+1}$. The capacitive conductive feature 66 is electrically connected to the first conductive feature 62 through one or more via feature 103 in the layer $V_{n+1}$. The capacitive conductive feature 68 is disposed on the metal layer $M_n$ underlying the metal layer $M_{n+1}$. The capacitive conductive feature 68 is electrically connected to the second conductive feature 64 through one or more via feature 105 in the layer $V_n$.

The transformer 102 in FIG. 13 includes the first and second conductive features inductively coupled and further includes the third and fourth conductive features 66 and 68 to provide capacitive coupling and increase the mutual inductance of the transformer 102. In FIG. 13, the transformer 102 is disposed in three metal layers ($M_n$, $M_{n+1}$ and $M_{n+2}$) and two layers of via features ($V_n$ and $V_{n+1}$). The first conductive feature 62 and the second conductive feature 64 are disposed on the metal layer $M_{n+1}$. The capacitive conductive feature 66 is disposed on the metal layer $M_n$ underlying the metal layer $M_{n+1}$. The capacitive conductive feature 66 is electrically connected to the first conductive feature 62 through one or more via feature 105 in the layer $V_n$. The capacitive conductive feature 68 is disposed on the metal layer $M_{n+2}$ overlying the metal layer $M_{n+1}$. The capacitive conductive feature 68 is electrically connected to the second conductive feature 64 through one or more via feature 103 in the layer $V_{n+1}$.

Figures 14, 15:
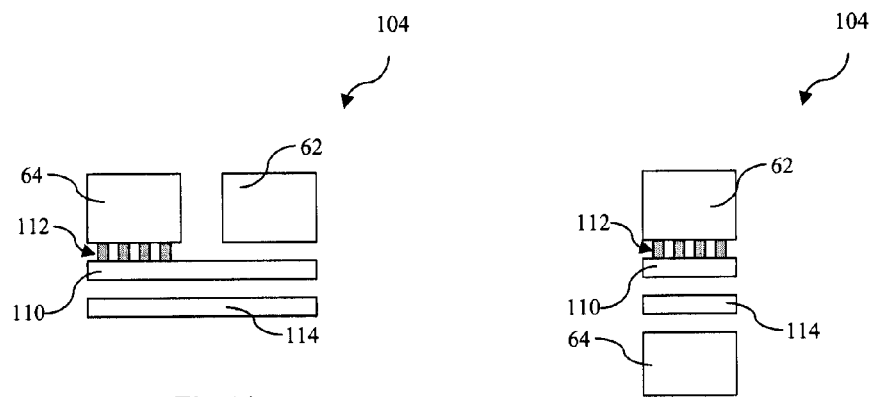
FIGS. 14-15 are sectional views of a transformer, in portion, with capacitive coupling according to other embodiments.

FIGS. 14 through 15 illustrate fragmental sectional views of a transformer 104 constructed according to various embodiments. The transformer 104 may be incorporated in the semiconductor structure 70 of FIG. 3 or incorporated in a different structure. The transformer 104 in FIG. 14 includes the first and second conductive features 62 and 64 inductively coupled. The second conductive feature 64 is configured to be in a same level with the first conductive feature 62, such as in a same metal layer. The second conductive feature 64 is configured to further surrounds the first conductive feature 62. The transformer 104 further includes a third conductive feature 110 disposed underlying the first and second conductive features 62 and 64. The third conductive feature 110 is further connected to the second conductive feature 64 through various conductive linking features 112. The transformer 104 further includes a fourth conductive feature 114 configured underlying the third conductive feature 110. The fourth conductive feature 114 may be configured to be floating or be grounded. Additionally, the fourth conductive feature 104 provides a shielding function to the transformer 104 from environmental circuits and/or substrate. The third conductive feature 110 and the fourth conductive feature 114 are designed as a top metal and bottom metal of a capacitor. In one embodiment, the first and second conductive features 62 and 64 are formed on one substrate, such as a silicon substrate while the third and fourth conductive features 110 and 114 are formed on another substrate, such as a packaging substrate or another silicon substrate. The conductive linking features 112 can be formed in a through silicon via (TSV) interposer between the two substrates.

The transformer 104 in FIG. 15 includes the first and second conductive features 62 and 64 inductively coupled. The first conductive feature 62 and second conductive feature 64 are configured to be in different levels, such as in different metal layers of an interconnect structure. Alternatively, the first conductive feature 62 and second conductive feature 64 are formed on different substrates bonded together through a three-dimensional packaging technique, such as TSV technique. The transformer 104 further includes a third conductive feature 110 and a fourth conductive feature 114 disposed between the first and second conductive features 62 and 64. The third conductive feature 110 is further connected to the first conductive feature 62 through various conductive linking features 112. The fourth conductive feature 114 may be configured to be floating or be grounded. The third conductive feature 110 and the fourth conductive feature 114 are designed as a top metal and bottom metal of a capacitor. The conductive linking features 112 can be formed in a TSV interposer between the two substrates.

Figure 16A:
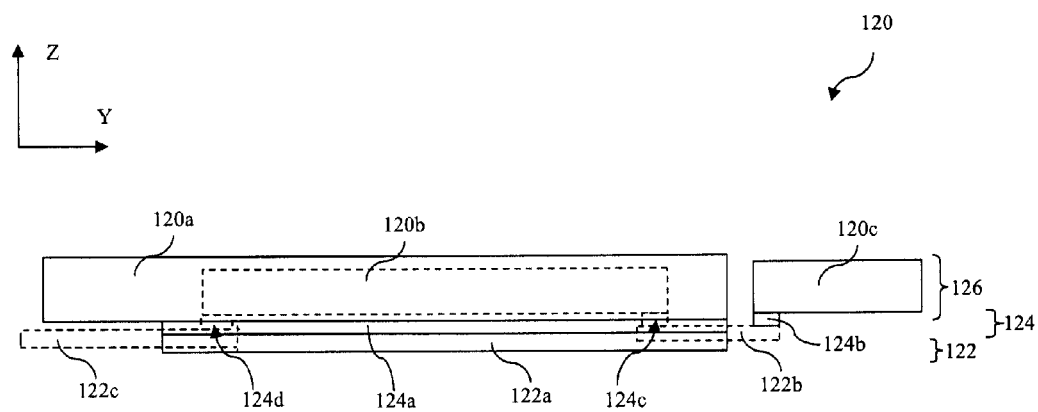
FIGS. 16a and 16b illustrate another embodiment of a transformer with capacitive coupling in sectional views.
Figure 16B:
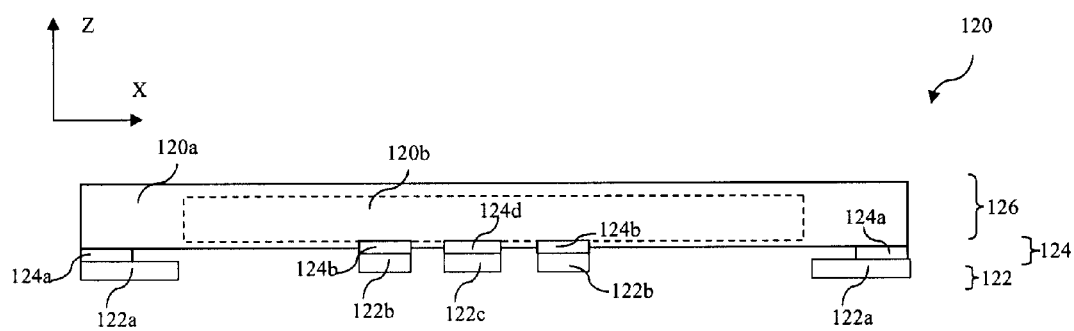
Figure 16C:
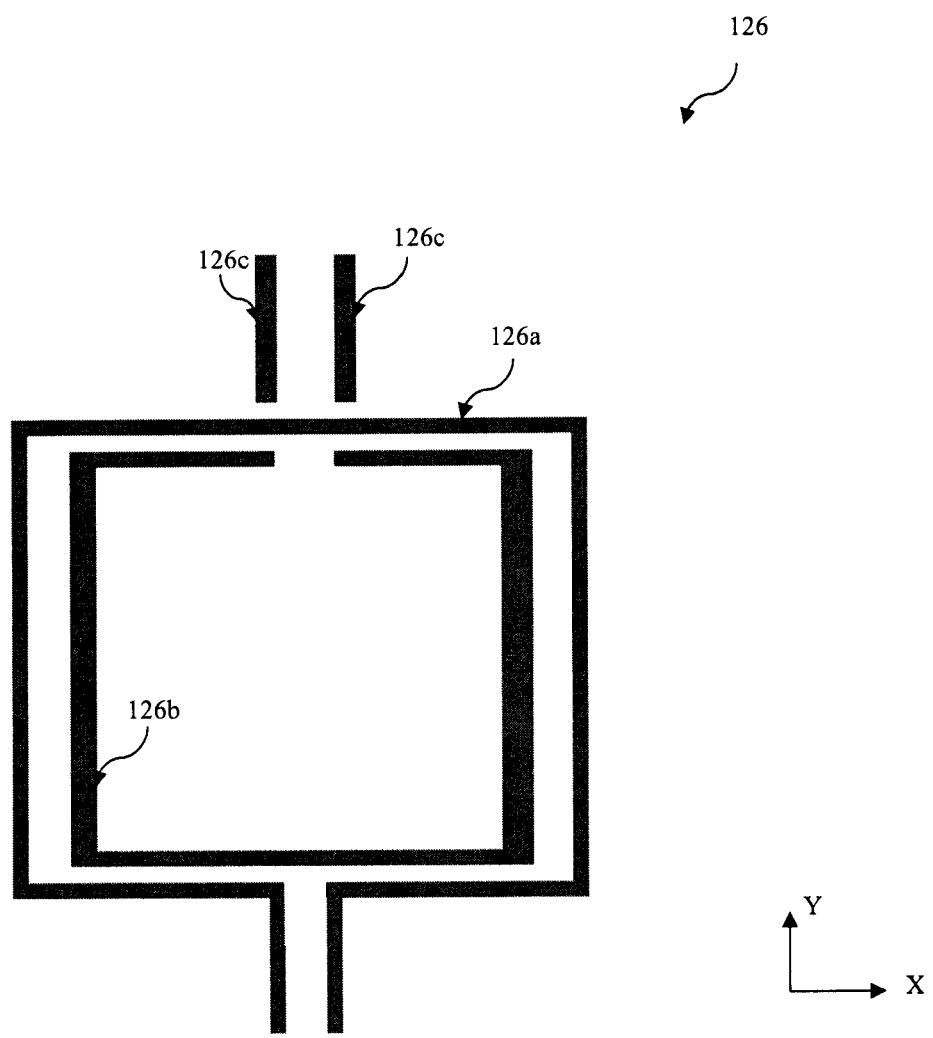
FIGS. 16c-16e illustrate various portions of the transformer in FIGS. 16a and 16b in top views.
Figure 16D:
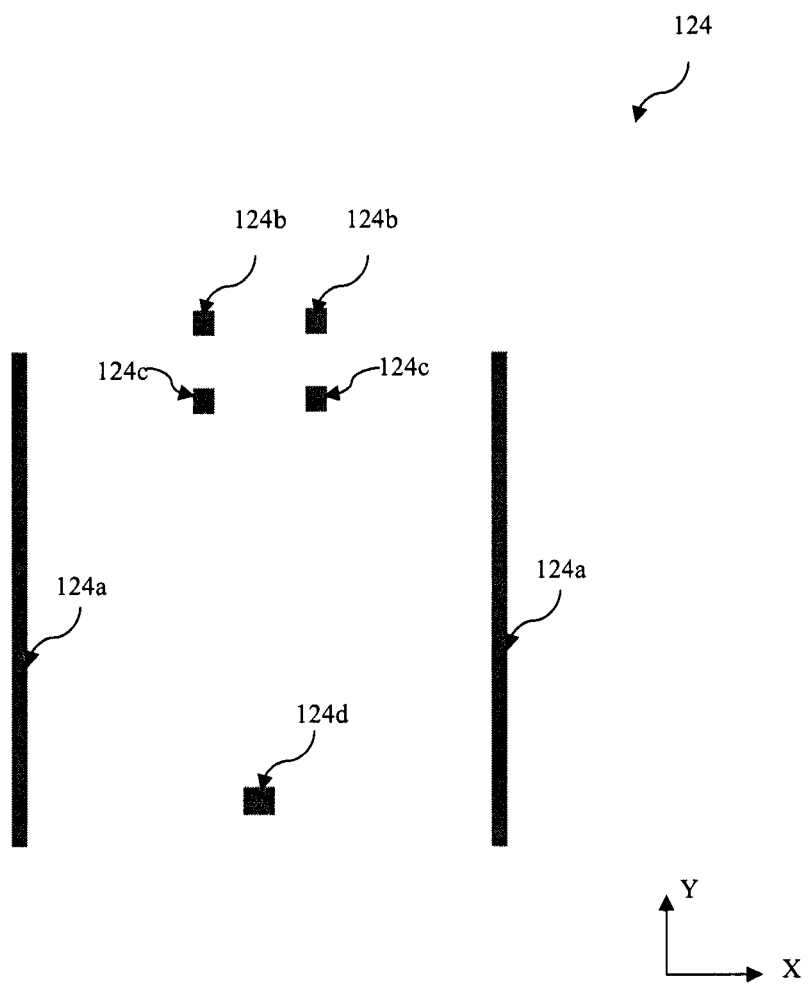
Figure 16E:
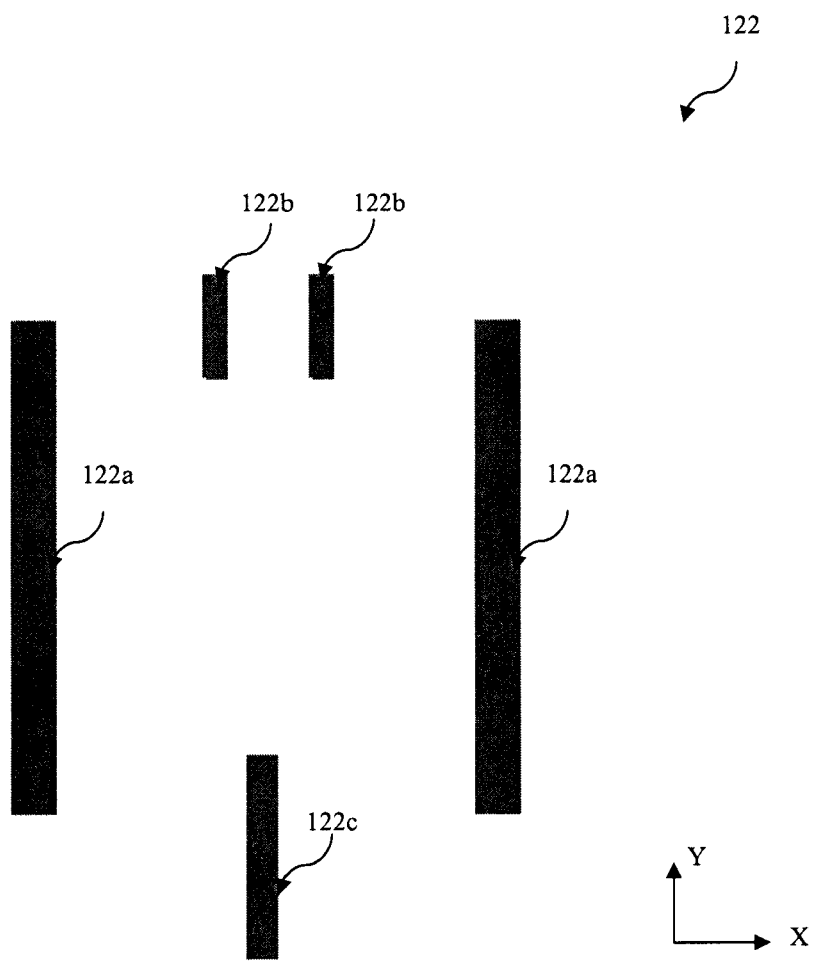

Another embodiment of a transformer 120 with capacitive coupling is illustrated in FIGS. 16a-16e. Specifically, FIGS. 16a and 16b are sectional views of the transformer 120 from different directions. FIGS. 16c, 16d and 16e are top views of various portions of the transformer 120, respectively. All features are not drawn on scale for simplicity. Particularly, the metal features in a same metal layer are not drawn with same thickness and height such that they can be easily identified and appreciated. Some features are drawn in broken lines for the same purposes. The transformer 120 is another embodiment of the transformer 56 in FIG. 2 integrated in the interconnect structure 54. The transformer 120 is described with reference to FIGS. 16a through 16e and FIG. 2. The transformer 120 is formed on the substrate 52 having a top surface 53 defined by X and Y directions. The third direction Z is defined to be perpendicular to both X and Y directions.

Referring to FIGS. 16a and 16b, the transformer 120 is formed in two consecutive metal layers interposed by a via layer interconnecting the two metal layers, which are respectively labeled as a first metal layer 122, a via layer 124 and a second metal layer 126, respectively, as illustrated in FIGS. 16a and 16b. Various features in the metal layers and the via layer are described in details with further reference to FIGS. 16c, 16d and 16e.

FIG. 16c illustrates a top view of the transformer 120, only the portion in the second metal layer 126. The transformer 120 includes a first coil element 126a, a second coil element 126b and extended conductive lines 126c. The first coil element 126a and second coil element 126b are configured to be inductively coupled.

FIG. 16d illustrates a top view of the transformer 120, only the portion in the via layer 124. The transformer 120 includes elongated via features 124a, first via features 124b, second via features 124c and a third via features 124d.

FIG. 16e illustrates a top view of the transformer 120, only the portion in the first metal layer 122. The transformer 120 includes first metal lines 122a, second metal lines 122b and a third metal line 122c.

Referring back to FIG. 16a as a sectional view of a Y-Z plane and FIG. 16b as a sectional view of a X-Z plane. The metal lines 126c are connected to the second coil element 126b through the via features 124b, the metal lines 122b and the via features 124c. The metal lines 126c serve as two terminals of the second coil element 126b for proper electrical bias. The metal lines 122a are connected to the first coil element 126a through the elongated via features 124a. The metal lines 122a are configured to provide capacitive coupling to the transformer 120. The metal lines 122c is connected to the second coil element 126a through the third via feature 124d. The metal line 122c is configured to provide capacitive coupling to the transformer 120.

Figure 17:
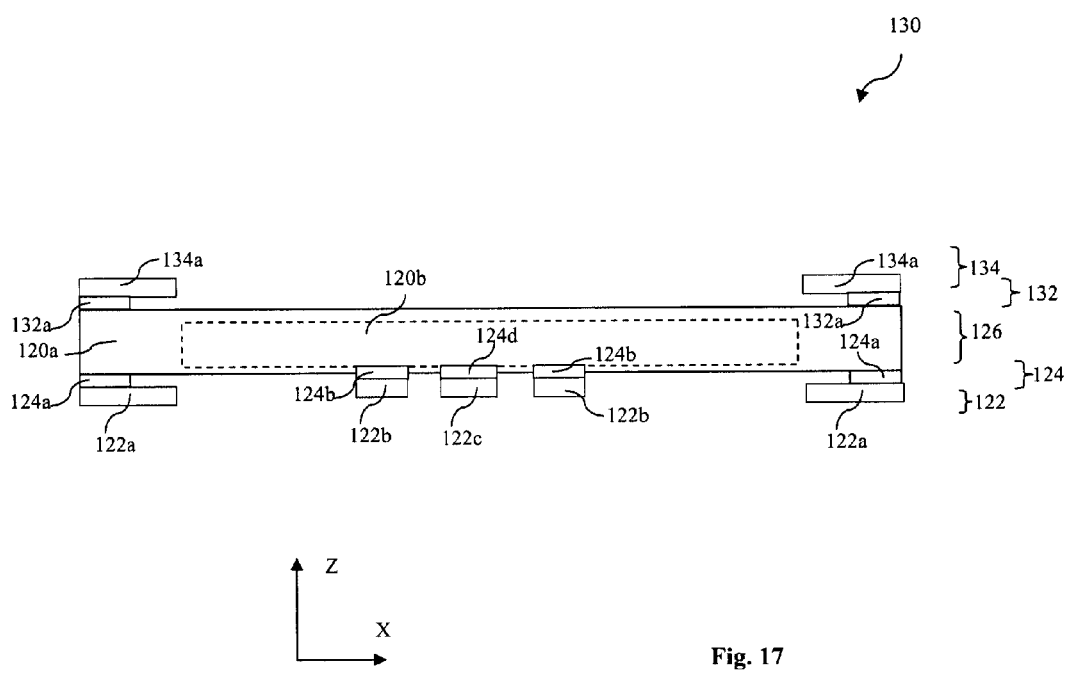
FIG. 17 illustrates another embodiment of a transformer with capacitive coupling in a sectional view.

Other metal features may be may be additionally configured and coupled to provide further capacitive coupling, such as illustrated in FIG. 17 as a sectional view of a transformer 130. The transformer 130 is similar to the transformer 120 but further includes a second via layer 132 and a third metal layer 134. Metal lines 134a in the third metal layer 134 are connected to the first coil element 120a through the via features 132a. The metal lines 134a provide additional capacitive coupling to the transformer 130.

Although embodiments of the present disclosure have been described in detail, those skilled in the art should understand that they may make various changes, substitutions and alterations herein without departing from the spirit and scope of the present disclosure. For example, the third and fourth conductive features for the capacitive coupling may be formed in sub-metal layers, such as in a level between the neighboring metal layers. In another example, the third and fourth conductive features may be simultaneously formed with integrated capacitors, such as crown capacitors. In another example, the disclosed transformer may be formed by utilizing a TSV interposer when the IC fabrication moves to advanced technology nodes, such as 40 nm or 28 nm. In yet another example, the transformer may includes an additional conductive feature connected to the third or fourth conductive feature to further enhance the capacitive coupling. In yet another example, the transformer may includes an additional conductive feature aligned with the first, second, third and fourth conductive features but are not connected any of those. Particularly, the additional conductive feature is configured to be floating or grounded for shield and/or capacitive coupling effect. The additional conductive feature may be disposed underlying, overlying, or approximate the transformer. In yet another example, one of the conductive features may be connected to a voltage source or a ground line. In furtherance of the example, the second conductive feature 64 (or the fourth conductive feature 68) is connected to a voltage source or a ground line.

In various example, one or more ground lines or voltage sources may be connected to different conductive features, respectively.

In one example, the dielectric material between the third and fourth conductive features may use a material having a high dielectric constant to increase the capacitive coupling therebetween. In another example, the dielectric material between the first and second conductive features may use a material having a high magnetic permeability to increase capacitive coupling and therefore to increase the coupling coefficient. In yet another example, the present disclosure is not limited to any particular application. For example, the disclosed structure of a transformer and method making the same may be used in any radio frequency integrated circuit (RFIC) applications, such as oscillator, low noise amplifier (LNA) or mixer. In another example, the semiconductor structure having the transformer with capacitive coupling may additionally include other structure, such as a dynamic random access second (DRAM) cell, field programmable gate-array (FPGA) and/or other microelectronic devices (collectively referred to herein as microelectronic devices). Of course, aspects of the present disclosure may be employed in many different applications, including sensor cells, logic cells, and others.

In various embodiments of a transformer integrated in a semiconductor structure, the transformer includes two coil elements inductively coupled and further includes one or capacitive coupling features integrated with the first and second coil elements to provide capacitive coupling to the transformer. Various advantages may be present in different examples or embodiments. In one example, the capacitive coupling feature(s) integrated in the transformer increase the mutual inductance M and the coupling coefficient K of the transformer. Therefore the disclosed transformer is referred to as the high-K transformer with capacitive coupling. In another example, the disclosed transformer has a high self-resonance frequency. In another example, the transformer has a application window with much broad frequency range while the mutual inductance is significantly high. In another embodiment, the disclosed transformer may be used for an RFIC application with frequency over 30 GHz with improved mutual inductance. Furthermore, the disclosed transformer with larger frequency window and high mutual inductance may be formed with small dimensions, such as in those advanced technology nodes. In yet another example, the disclosed transformer has reduced loss and a increased quality factor due to the shield functions from the third and/or fourth conductive features.

A semiconductor device is disclosed according to one of the broader forms of the present disclosure. In one embodiment, the semiconductor device includes a semiconductor substrate having an integrated circuit (IC) device; an interconnect structure disposed on the semiconductor substrate and coupled with the IC device; and a transformer disposed on the semiconductor substrate and integrated in the interconnect structure. The transformer includes a first conductive feature; a second conductive feature inductively coupled with the first conductive feature; a third conductive feature electrically connected to the first conductive feature; and a fourth conductive feature electrically connected to the second conductive feature. The third and fourth conductive features are designed and configured to be capacitively coupled to increase a coupling coefficient of the transformer.

In one embodiment of the disclosed semiconductor device, the first conductive feature is electrically connected with first two ports and is further configured to form a first coil element; and the second conductive feature is electrically connected with second two ports and further configured to form a second coil element. In another embodiment, the first coil element includes multiple turns and the second coil element includes multiple turns.

In another embodiment, the third conductive feature has at least two ends configured to be electrically floating; and the fourth conductive feature has at least two ends configured to be electrically floating.

In yet another embodiment, the interconnect structure includes a plurality of metal layers having a first metal layer, a second metal layer and a third metal layer; the first and second conductive features substantially belong to the first metal layer; the third conductive feature belong to the second metal layer; the fourth conductive feature belong to the third metal layer; and the first, second, third and fourth conductive feature are substantially aligned in a direction perpendicular to the semiconductor substrate to enhance respective inductive and capacitive couplings. The third conductive features may be electrically connected to the first conductive feature through a first via feature between the first and second metal layers. The fourth conductive features may be electrically connected to the second conductive feature though at least second via feature between the first and third metal layers. In one example, the second metal layer is underlying the first metal layer; and the third metal layer is underlying the second metal layer. In another example, the second metal layer is underlying the first metal layer; and the third metal layer is overlying the first metal layer.

In another embodiment, the semiconductor device further includes a fifth conductive feature electrically connected to the third conductive feature to further enhance capacitive coupling.

The present disclosure also provides another embodiment of an integrated circuit. The integrated circuit includes a transformer disposed on a substrate. The transformer includes a first inductive coupling feature having first two ports; a second inductive coupling feature having second two ports; and a first capacitive coupling feature electrically connected to the first inductive coupling feature and having at least first two ends configured to be floating, wherein the first and second inductive coupling features are configured to be inductively coupled, and the first capacitive coupling feature is configured to be capacitively coupled with the second inductive coupling feature.

In one embodiment, the integrated circuit further includes a second capacitive coupling feature electrically connected to the second inductive coupling feature and having at least second two ends configured to be floating, wherein the second capacitive coupling feature is configured to be capacitively coupled with the first inductive coupling feature.

In furtherance of the embodiment, the first and second inductive coupling features and the first and second capacitive coupling features are substantially aligned within a same region of the substrate in a top view toward the substrate to enhance corresponding inductive and capacitive couplings. In another embodiment, the integrated circuit further includes an interconnect structure having a plurality of metal layers disposed on the substrate, wherein the transformer is integrated in the interconnect structure. In one example, the first and second inductive coupling features are substantially configured in a same metal layer of the interconnect structure.

In another embodiment, the second capacitive coupling feature is underlying the first and second inductive coupling features and the third capacitive coupling features; and the second capacitive coupling feature is further configured to provide a shielding function. In another embodiment, both the first and second capacitive coupling features are underlying the first inductive coupling feature and are overlying the second inductive coupling feature. The integrated circuit may further include an additional substrate configured such that the transformer is distributed between the substrate and the additional substrate; and a through silicon via (TSV) interposer disposed between the substrate and the additional substrate, wherein various features of the transformer are coupled at least partially the TSV interposer. In another embodiment, one of the first inductive feature, the second inductive feature, the first capacitive feature and the second capacitive feature is connected to one of a voltage source and a ground line.

The present disclosure also provides an embodiment of a method of fabricating a semiconductor device. The method includes forming an interconnect structure over a substrate, the interconnect structure having layers of metal lines and levels of via features interconnecting the layers of metal lines, wherein the forming the interconnect structure includes forming a transformer with a subset of the metal lines and a subset of the via features, wherein the transformer includes a first conductive feature having first two ports; a second conductive feature having second two ports; a third conductive feature electrically connected to the first conductive feature and having at least first two ends configured to be electrically floating; and a fourth conductive feature electrically connected to the second conductive feature and having at least second two ends configured to be electrically floating. The first and second conductive features are configured to be inductively coupled, and the third and fourth conductive features are configured to be capacitively coupled.

In one embodiment, the forming of the interconnect structure includes forming a first metal layer having the first and second conductive features; forming a second metal layer having the third conductive feature; and forming a third metal layer having the fourth conductive feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A method comprising:
forming a first conductive feature having first two ports over a semiconductor substrate;
forming a second conductive feature having second two ports over the semiconductor substrate, wherein the first and second conductive features are inductively coupled; and
forming a third conductive feature over the semiconductor substrate, the third conductive feature being electrically coupled to at least one of the first and second conductive features and having an end that is electrically floating, the third conductive feature being capacitively coupled with at least one of the first and second conductive features.

2. The method of claim 1, further comprising forming a fourth conductive feature over the semiconductor substrate, the fourth conductive feature being electrically coupled to at least one of the first and second conductive features and having an end that is floating, the fourth conductive feature being capacitively coupled with at least one of the first and second conductive features.

3. The method of claim 2, wherein the third conductive feature is capacitively coupled with the first conductive feature, and
wherein the fourth conductive feature is capacitively coupled with the second conductive feature.

4. The method of claim 2, wherein forming the third conductive feature over the semiconductor substrate includes forming the third conductive feature in a first metal layer,
wherein forming the first conductive feature having first two ports over the semiconductor substrate includes forming the first conductive feature in a second metal layer that is disposed over the first metal layer,
wherein forming the second conductive feature having second two ports over the semiconductor substrate includes forming the second conductive feature in the second metal layer, and
wherein forming the fourth conductive feature over the semiconductor substrate includes forming the third conductive feature in a third metal layer that is disposed over the second metal layer.

5. The method of claim 2, wherein forming the third conductive feature over the semiconductor substrate includes forming the third conductive feature in a first metal layer,
wherein forming the fourth conductive feature over the semiconductor substrate includes forming the third conductive feature in a second metal layer that is disposed over the first metal layer, and
wherein forming the first conductive feature having first two ports over the semiconductor substrate includes forming the first conductive feature in a third metal layer that is disposed over the second metal layer, and
wherein forming the second conductive feature having second two ports over the semiconductor substrate includes forming the second conductive feature in the third metal layer.

6. The method of claim 1, further comprising forming a via over the first and second conductive features, wherein the via extends from the first and second conductive features to the third conductive feature.

7. A method comprising:
forming a first conductive feature over a substrate;
forming a second conductive feature over the substrate;
forming a third conductive feature over the substrate, the third conductive feature being electrically coupled to the first conductive feature and capacitively coupled to the second conductive feature, the third conductive feature having an end that is electrically floating; and
forming a via over the first and second conductive features, wherein the via extends continuously from the first conductive feature to the second conductive feature.

8. The method of claim 7, wherein the first and second conductive features are inductively coupled.

9. The method of claim 7, wherein the first and second conductive features are formed in the same metal layer, and wherein the second conductive feature surrounds the first conductive feature.

10. The method of claim 7, wherein the third conductive feature is formed of a plurality of metal lines that do not form a closed electrical path.

11. The method of claim 7, wherein forming the first, second, and third conductive features over the substrate includes forming the first, second, and third conductive features in an interconnect structure over the substrate.

12. The method of claim 7, further comprising forming a fourth conductive feature over the substrate, the fourth conductive feature being electrically coupled to the second conductive feature and capacitively coupled to the first conductive feature.

13. The method of claim 12, wherein the fourth conductive feature does not form a closed electrical path.

14. A method of fabricating a semiconductor device, comprising:
forming an interconnect structure over a substrate, the interconnect structure having layers of metal lines and levels of via features interconnecting the layers of metal lines, wherein the forming the interconnect structure includes forming a transformer with a subset of the metal lines and a subset of the via features, the transformer having:
a first conductive feature having first two ports;
a second conductive feature having second two ports;
a third conductive feature electrically connected to the first conductive feature and having at least first two ends that are electrically floating; and
a fourth conductive feature electrically connected to the second conductive feature, wherein the first and second conductive features are inductively coupled, and the third and fourth conductive features are capacitively coupled.

15. The method of claim 14, wherein the forming of the interconnect structure includes:
forming a first metal layer having the first and second conductive features;
forming a second metal layer having the third conductive feature; and
forming a third metal layer having the fourth conductive feature.

16. The method of claim 14, wherein the first conductive feature is electrically connected with the first two ports and is a first coil element, and
wherein the second conductive feature is electrically connected with the second two ports and is a second coil element.

17. The method of claim 14, wherein the fourth conductive feature has at least second two ends that are electrically floating.

18. The method of claim 14, wherein the second conductive feature surrounds the first conductive feature.

19. The method of claim 7, wherein the first conductive feature includes a first coil element and the second conductive feature includes a second coil element.

20. The method of claim 1, further comprising forming a via over the first and second conductive features, wherein the via extends continuously from the first conductive feature to the second conductive feature.

* * * * *